United States Patent [19]

Ohmori et al.

[11] Patent Number: 4,775,840
[45] Date of Patent: Oct. 4, 1988

[54] NOISE REMOVING CIRCUIT

[75] Inventors: Hideharu Ohmori, Hino; Masaharu Kamigaki, Tokyo, both of Japan

[73] Assignee: Iwatsu Electric Co., Ltd., Tokyo, Japan

[21] Appl. No.: 942,531

[22] Filed: Dec. 16, 1986

[30] Foreign Application Priority Data

Dec. 25, 1985 [JP] Japan .................. 60-290844

[51] Int. Cl.$^4$ ............................................. H03K 5/22
[52] U.S. Cl. .................... 328/111; 307/234; 307/520; 328/165
[58] Field of Search .............. 307/520, 234, 265; 328/109, 110, 111, 120, 165; 377/71

[56] References Cited

U.S. PATENT DOCUMENTS

| | | | |
|---|---|---|---|
| 3,652,943 | 3/1972 | Piccirilli et al. | 328/111 |
| 3,753,135 | 8/1973 | Kastner et al. | 328/111 |
| 3,946,383 | 3/1976 | Hughes et al. | 328/111 |
| 3,961,203 | 6/1976 | Hutch | 328/109 |
| 3,997,798 | 12/1976 | Breimesser | 328/111 |
| 4,353,032 | 10/1982 | Taylor | 328/111 |

FOREIGN PATENT DOCUMENTS 47803 3/1978 Fed. Rep. of Germany ...... 307/234

OTHER PUBLICATIONS

Kazi et al., "Pulse Width Discriminator System". IBM Tech. Disclosure, vol. 13, No. 1, Jun. 1970, pp. 36-37.

*Primary Examiner*—Stanley D. Miller
*Assistant Examiner*—Timothy P. Callahan
*Attorney, Agent, or Firm*—Emmanuel J. Lobato; Robert E. Burns

[57] ABSTRACT

A noise removing circuit is disclosed for removing noise of a duration shorter than a predetermined period of time from an input signal. A monitor circuit is provided for monitoring the input signal to detect whether each time interval occuring between a change detected and a just succeeding change in the input signal is longer or shorter than the predetermined period of time. An output signal is delivered from a one-bit memory. A selector is provided for selectively applying the input signal or the output signal to the one-bit memory in dependent upon whether the time interval between the changes in the input signal is longer or shorter than the predetermined period of time, so that noise of the duration shorter than the predetermined period of time is not included in the output signal.

4 Claims, 5 Drawing Sheets

NOISE REMOVING CIRCUIT

BACKGROUND OF THE INVENTION

The present invention relates to a noise removing circuit which removes noise digitally in a digital signal receiving circuit.

In case of receiving binary data of logic "1" and "0", a noise removing circuit is used for removing noise which gets mixed into the data during transmission. However, noise less than a predetermined time duration cannot be surely removed by conventional art.

SUMMARY OF THE INVENTION

An object of the present invention is to provide a noise removing circuit which obviates the above defect and ensures the removal of noise less than a present pulse width.

In accordance with the present invention, there is provided a noise removing circuit for removing noise of a duration shorter than a predetermined period of time from an input signal, comprising: monitor means for monitoring the input signal to detect whether each time interval occurring between a change detected and a just succeeding change in the input signal is longer or shorter than said predetermined period of time; one-bit memory for delivering an output signal; and selection means for selectively applying the input signal or the output signal to said one-bit memory in dependence upon whether said time interval between said changes in said input signal is longer or shorter than said predetermined period of time, so that noise of the duration shorter than said predetermined period of time is not included in the output signal.

BRIEF DESCRIPTION OF THE DRAWINGS

The present invention will be described in detail below in comparison with conventional art with reference to the accompanying drawings, in which.

DETAILED DESCRIPTION

To make differences between prior art and the present invention clear, examples of conventional art will first be described.

Figure 1:
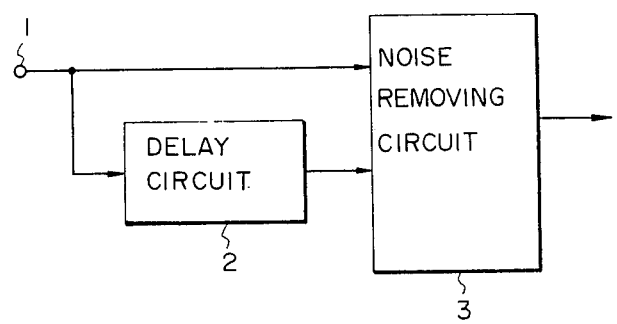
FIG. 1 is a block diagram illustrating an example of a conventional noise removing circuit.
Figure 2:
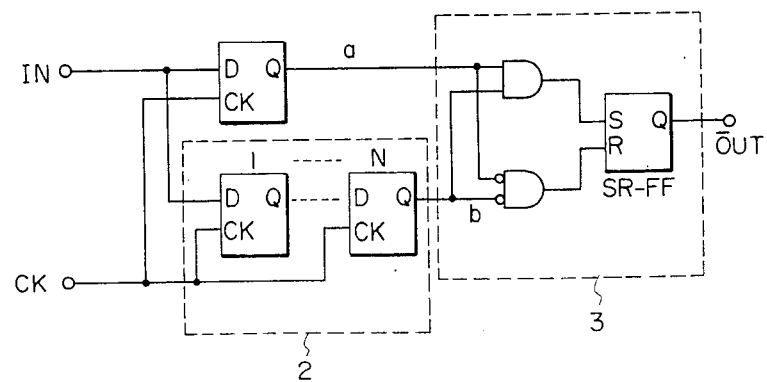
FIG. 2 is a block diagram showing a specific example of the circuit construction of the prior art example illustrated in FIG. 1.
Figure 3:
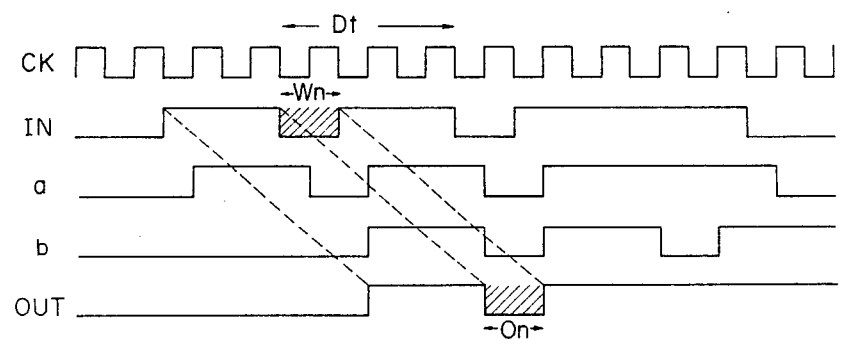
FIG. 3 is a timing chart explanatory of the operation of the circuit shown in FIG. 2.

FIG. 1 illustrates a conventional noise removing circuit, in which reference numeral 2 indicates a delay circuit and 3 a noise removing circuit which removes noise through use of signals applied thereto from an input terminal 1 and the delay circuit 2. FIG. 2 shows a specific example of the conventional noise removing circuit in which reference numeral 2 denotes the delay circuit and 3 the noise removing circuit. The delay circuit 2 can be formed by N stages of flip-flop circuits, and in the noise removing circuit 3 a flip-flop circuit SR-FF is set or reset when the signal a from the input terminal and the output b from the delay circuit 2 are coincident with each other. With the circuit arrangement depicted in FIG. 2, noise can mostly be removed if a pulse width of the noise is less than a delay time of the delay circuit. However, in a case where the delay circuit is formed by, for instance, three stages of flip-flops, with its delay time represented by Dt for removing noise of a width equal to the total duration of up to three clock pulses, if a signal is applied from the terminal IN at such timing as shown in a timing chart of FIG. 3, noise would not be removed but be output as indicated by On although its pulse width Wn is less than the delay time Dt of the delay circuit 2.

The present invention will hereinafter be described in detail.

Figure 4:
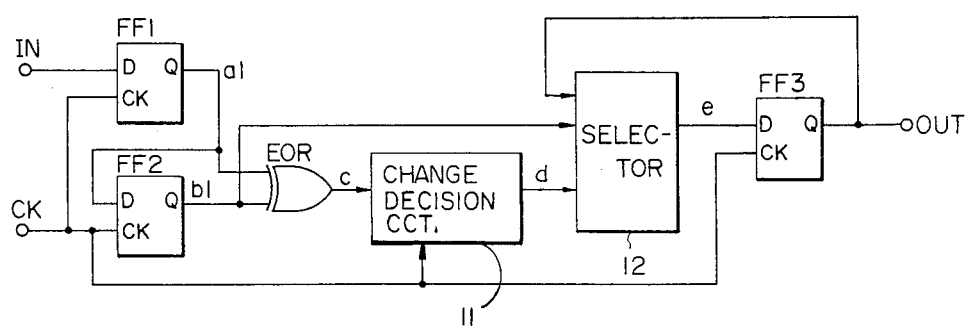
FIG. 4 is a block diagram illustrating an embodiment of the present invention.

FIG. 4 illustrates a noise removing circuit of the present invention. Reference characters FF1 to FF3 identify D flip-flops, EOR an exclusive OR circuit, 11 a change decision circuit, and 12 a selector. The change decision circuit 11 is a circuit which decides whether the time width of the input signal IN at the level "0" or "1" is larger than the time width equal to the duration of N clock pulses. The selector 12 is a circuit which is switched by the output pulse d of the change decision circuit 11 so that it selectively applies the output b1 of the flip-flop FF2 or the output OUT of the flip-flop FF3, as the output e, to the flip-flop FF3 which operates as a one-bit memory. The change decision circuit 11 can be constituted by a synchronous-clearing type shift register or a counter and the like.

Figure 5:
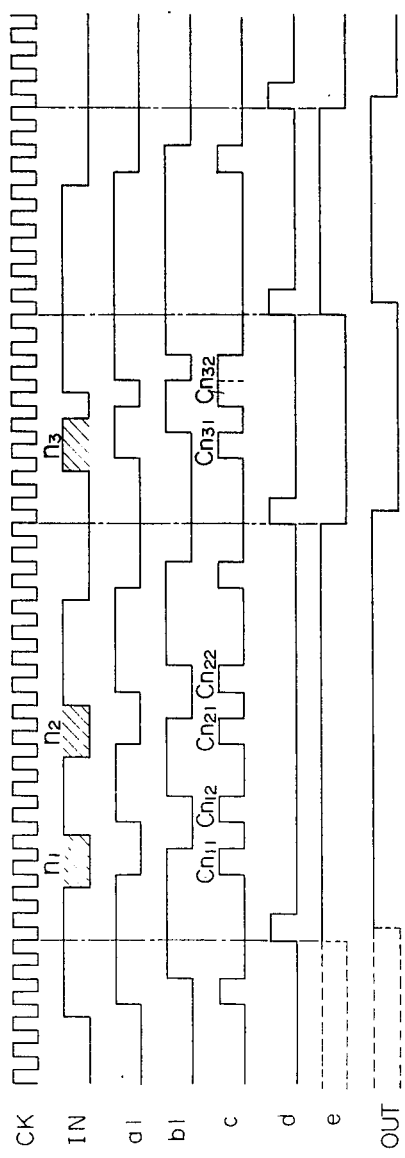
FIG. 5 is a timing chart explanatory of the operation of the embodiment illustrated in FIG. 4.

If the input signal IN undergoes a change from the level "0" to "1" or from "1" to "0", the outputs a1 and b1 differ from each other for only one clock pulse duration and the EOR output c goes high and remains unchanged for only one clock pulse duration, indicating a change in the input IN. The change decision circuit 11 responds to the high-level output c of the EOR to start monitoring the input signal for N clock pulses and provides, by its output pulse d, the change in the input signal to the selector 12 after N clock pulses. In the event that the input signal IN has newly changed when the input signal is less than the pulse width of N clock pulses, since the pulse width of the input signal is short, the input signal is regarded as noise and the shift register or counter in the change decision circuit 11 is reset, avoiding the transmission of the input variation to the selector 12. The selector 12 responds to the input change signal d from the change decision circuit 11 to apply either one of the output b1 of the flip-flop FF2 and the output signal OUT to the flip-flop FF3. That is, the output b1 or the output signal OUT is provided to the input of the flip-flop FF3 depending upon whether the input change signal d is high or low. FIG. 5 shows, by way of example, the timing of operation in a case where the delay circuit 2 is formed by three stages of flip-flops (for removing noise of a width equal to the total duration of up to three clock pulses). Reference characters $c_{n11}, c_{n12}, \ldots c_{n32}$ on the signal c indicate pulses which correspond to noises $n_1$, $n_2$ and $n_3$ to be removed. By such an operation as described above, the time interval occurring between the preceding and succeeding changes in the input signal IN is monitored through change monitoring means (FF1, FF2, EOR, and 11). The selector 12 and the flip-flop FF3 are provided so that when the above time interval is in excess of a fixed length, the input signal having changed is output, whereas when the time interval is within the fixed length, it is decided that a change in the input signal has been caused by noise, and the output is retained unchanged.

Figure 6:
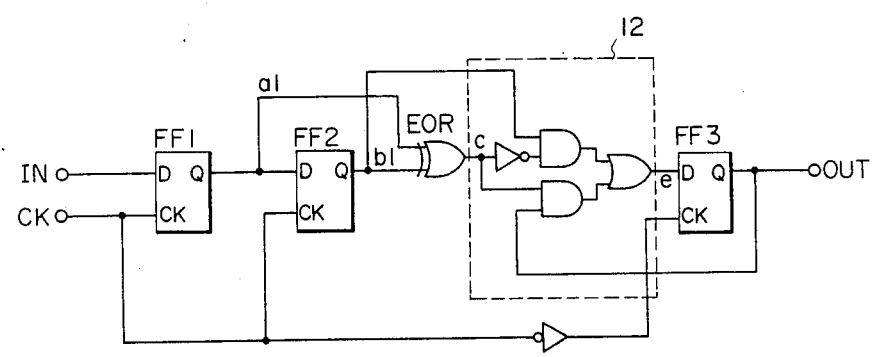
FIG. 6 is a block diagram illustrating another embodiment of the present invention.
Figure 7:
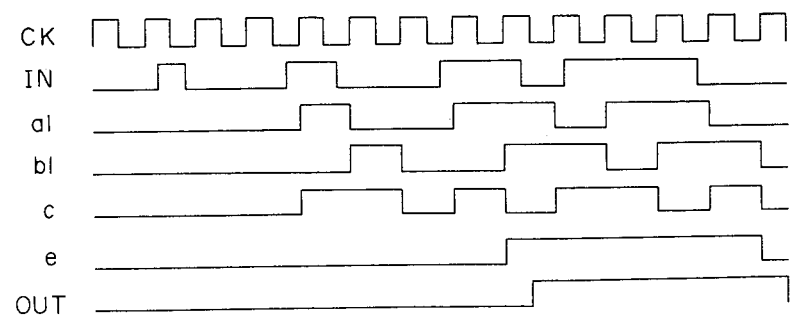
FIG. 7 is a timing chart explanatory of the operation of the embodiment illustrated in FIG. 6.

Especially when the delay circuit is formed by one stage of flip-flop, such a circuit as shown in FIG. 6 is employed which does not include the change decision circuit 11; namely, the above-mentioned monitoring means can be constituted by a smaller number of circuits, i.e. by the flip-flops FF1 and FF2 and the exclusive OR circuit EOR. With the circuit depicted in FIG. 6, when a change has occurred in the input signal, the output signal is held unchanged and in the absence of such a change, the input signal is output as it is. When the delay circuit is formed by one stage of flip-flop, it is possible to remove noise which occurs within the width of one clock pulse. In case of noise less than one clock pulse width, the EOR output c remains high for two clock pulses, holding the output signal OUT. By holding the output while the EOR output is high, the output remains unchanged and the noise can be removed. In case of noise whose pulse width exceeds one clock pulse width, there is a point of time at which the EOR output c goes low and the output signal OUT varies while the EOR output remains low, as shown in FIG. 7.

Figure 8A:
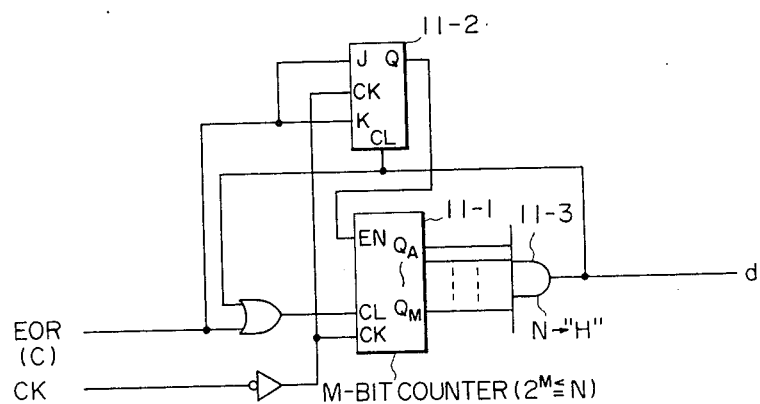
FIGS. 8A and 8B are block diagrams illustrating examples of a change decision circuit for use in the present invention.

The change decision circuit 11 can be constituted as follows: (1) FIG. 8A illustrates an example which employs a counter system. In the illustrated circuit, when the EOR output c goes high in response to a change in the input signal, a counter 11-1 is initialized by the negative-going edge of the clock pulse CK and, at the same time, its EN (enable) terminal is made high by a JK flip-flop 11-2, so the counter starts counting upward. In a case where a change in the input signal is not attributable to noise, when the counter has counted N times, a coincidence circuit (AND) 11-3 provides a high-level signal at its output d, by which the JK flip-flop 11-2 is reset, clearing the counter 11-1 to its initial (standby) state. Accordingly, the output d remains high for the duration of only one clock pulse.

In the case where the change in the input signal results from noise of a width less than the total width of N clock pulses, the input signal varies again before the counter 11-1 counts the clock pulses CK N times. In this instance, the counter 11-1 counts upward in response to the first change in the input signal and before providing the output d, the counter 11-1 is initialized by the next change in the input signal and the JK flip-flop 11-2 is also toggled, by which the EN (enable) terminal of the counter 11-1 is made low, returning it to its initial state. Accordingly, it is decided that the input signal has not changed, and no output is produced at the output d.

Figure 8B:
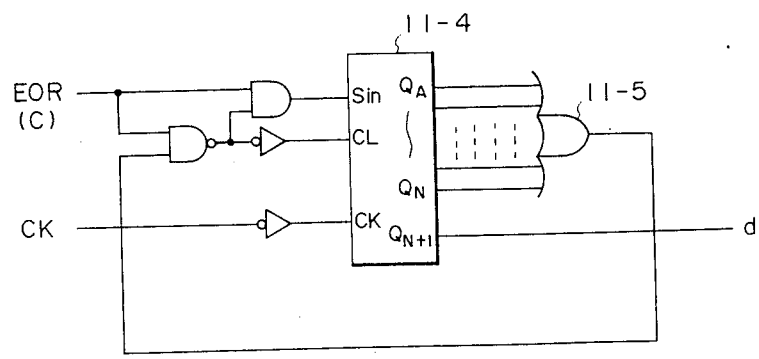

(2) FIG. 8B illustrates an example which employs a shift register system. In the initial state of this circuit (in which outputs $Q_4$ to $Q_{N+1}$ of a shift register 11-4 are all low), when the EOR output c goes high in response to a change in the input signal, it is input into the shift register 11-4 by the negative-going edge of the clock pulse CK.

If the change in the input signal is not attributable to noise, a high output is provided at the output d for the duration of only one clock pulse, by the negative-going edge of an Nth clock pulse CK after the EOR output goes high.

Where the change in the input signal has arisen from noise of a width less than the total width of N clock pulses, the high output which is information indicating the previous change remains at any one of the outputs $Q_4$ to $Q_N$ of the shift register 11-4, and this can be detected by an OR circuit 11-5. At this time, the output of the OR circuit 11-5 is high and the output c of the EOR is also high. In such a case, the shift register 11-4 is cleared to its initial state. The shift register is the synchronous clearing type. Accordingly, no output is derived at the output d; so it is decided that no change has occurred in the input signal.

The reason for which the shift register 11-4 has (N+1) outputs is to guarantee that either one of the clock pulse CK or the output c of the EOR may be provided earlier than the other as long as its delay relative to the other is less than one-half of the clock period. If it is assured that the output c of the EOR is always delayed from the clock pulse CK, then the shift register 11-4 may be of an N-bit structure and needs only to be shifted by the positive-going edge of the clock pulse, providing its output $Q_N$ at the output d.

As described above in detail, according to the conventional circuit, even noise of a width which can be removed according to the timing relation cannot be removed but is output as it is in some cases. With the circuit of the present invention, however, it is possible to remove noise smaller than a preset pulse width at all times.

What we claim is:

1. A noise removing circuit for removing noise of a duration shorter than a predetermined period of time from an input signal of binary signal configuration, comprising: monitor means for monitoring the input signal to generate an input change signal indicative of whether each time interval occurring between a significant instant detected and a just succeeding significant instant in the input signal is longer or shorter than said predetermined period of time; a one-bit memory for delivery of an output signal; selection means connected to said monitor means and said one-bit memory for selectively applying the input signal or the output signal to said one-bit memory in dependence upon the state of the input change signal, so that noise of the duration shorter than said predetermined period of time is not included in the output signal, said monitor means comprises a first D flip-flop having a D-terminal for receiving said input signal, a second D flip-flop having a D-terminal for receiving the Q output of the first D flip-flop and a Q output connected to one input of said selection means, an exclusive OR circuit having two input terminals for receiving the Q output of the first D flip-flop and the Q output of the second D flip-flop, respectively, and an output for developing said input change signal, said predetermined period of time being less than one clock duration of clock pulses applied to said first D flip-flop and said second D flip-flop.

2. A noise removing circuit for removing noise of a duration shorter than a predetermined period of time from an input signal of binary signal configuration, comprising: monitor means for monitoring the input signal to generate an input change signal indicative of whether each time interval occurring between a significant instant detected and a just succeeding significant instant in the input signal is longer or shorter than said predetermined period of time; a one-bit memory for delivery of an output signal; selection means connected to said monitor means and said one-bit memory for selectively applying the input signal or the output signal to said one-bit memory in dependence upon the state of the input change signal, so that noise of the duration shorter than said predetermined period of time is not included in the output signal, said monitor means comprises a first D flip-flop having a D-terminal for receiving said input signal, a second D flip-flop having a D-terminal for receiving the Q output of the first D flip-flop and a Q output connected to one input of said selection means, an exclusive OR circuit having two input terminals for receiving the Q output of the first D flip-flop and the Q output of the second D flip-flop, respectively, and an output, and a change decision circuit connected to the output of the exclusive OR circuit to provide an input change signal indicative of whether each time interval is longer or shorter than said predetermined time; which is more than one clock duration of clock pulses applied to said first D flop-flop and said second D flip-flop.

3. A noise removing circuit according to claim 2, in which said change decision circuit comprises a J-K flip-flop having a J-terminal for receiving the output of the exclusive OR circuit, a scale-of-M counter ($2^M \leq$ an integer N less than zero) having an input terminal for receiving the Q output of the J-K flip-flop, an AND circuit having inputs connected to the scale-of-M counter and an output for developing the input change signal, and an OR circuit for clearing the scale-of-M counter in response to the output of the exclusive OR circuit or the output of the AND circuit.

4. A noise removing circuit according to claim 2, in which said change decision circuit comprises a shift register having an input for receiving the output of the exclusive OR circuit and (N+1) outputs, an OR circuit having N inputs for receiving N outputs of the shift register and an output, and input means for applying the output of the exclusive OR circuit to the input of the shift register in response to no output of said OR circuit, the input change signal being obtained from the (N+1)th output of the shift register.

* * * * *